(12) United States Patent
Tarui et al.

(10) Patent No.: US 6,750,501 B2
(45) Date of Patent: Jun. 15, 2004

(54) TRANSISTOR TYPE FERROELECTRIC BODY NONVOLATILE STORAGE ELEMENT

(75) Inventors: Yasuo Tarui, 9-27-304, Seda 1-chome, Setagaya-ku, Tokyo (JP); Kazuo Sakamaki, Tokyo (JP)

(73) Assignees: Yasuo Tarui, Tokyo (JP); Nippon Precision Circuits Inc., Tokyo (JP)

( * ) Notice: Subject to any disclaimer, the term of this patent is extended or adjusted under 35 U.S.C. 154(b) by 0 days.

(21) Appl. No.: 10/103,506

(22) Filed: Mar. 21, 2002

(65) Prior Publication Data

US 2002/0149042 A1 Oct. 17, 2002

(30) Foreign Application Priority Data

Apr. 16, 2001 (JP) ........................................ 2001-116439

(51) Int. Cl.[7] ..................... H01L 27/108; H01L 29/76; H01L 29/94; H01L 31/119
(52) U.S. Cl. ............................... 257/310; 438/591
(58) Field of Search ................. 257/300, 296, 257/310; 438/591

(56) References Cited

U.S. PATENT DOCUMENTS

| | | | | |
|---|---|---|---|---|
| 5,384,729 A | * | 1/1995 | Sameshima | 365/145 |
| 5,424,238 A | * | 6/1995 | Sameshima | 438/3 |
| 6,048,740 A | * | 4/2000 | Hsu et al. | 438/3 |
| 6,051,865 A | * | 4/2000 | Gardner et al. | 257/411 |
| 6,124,620 A | * | 9/2000 | Gardner et al. | 257/411 |
| 6,303,481 B2 | * | 10/2001 | Park | 438/591 |
| 6,462,366 B1 | * | 10/2002 | Hsu et al. | 257/295 |
| 2001/0011743 A1 | * | 8/2001 | Arita et al. | 257/314 |
| 2001/0028582 A1 | * | 10/2001 | Tarui et al. | 365/200 |
| 2002/0115252 A1 | * | 8/2002 | Haukka et al. | 438/240 |
| 2002/0123212 A1 | * | 9/2002 | Kunikiyo | 438/585 |
| 2002/0158292 A1 | * | 10/2002 | Abe et al. | 257/408 |
| 2002/0190274 A1 | * | 12/2002 | Lung | 257/200 |
| 2002/0195643 A1 | * | 12/2002 | Harada | 257/310 |

* cited by examiner

Primary Examiner—Erik Kielin
(74) Attorney, Agent, or Firm—Jordan and Hamburg LLP

(57) ABSTRACT

A ferroelectric body transistor having a structure of MFMIS (conductor film)-ferroelectric film-conductor film-insulating film-semiconductor) including a gate insulator capacitor having an MIS structure, a low dielectric constant layer restraining layer interposed between an insulating film made of a material having a high inductive capacity of $CeO_2$ and a semiconductor substrate to thereby restrain a low dielectric constant layer of $SiO_2$ or the like from being produced at an interface between the insulating film and the semiconductor substrate and restrain a capacitance from being reduced. An area of the gate insulator capacitor can be reduced and highly integrated formation is provided.

8 Claims, 7 Drawing Sheets

PRIOR ART

PRIOR ART

PRIOR ART

TRANSISTOR TYPE FERROELECTRIC BODY NONVOLATILE STORAGE ELEMENT

BACKGROUND OF THE INVENTION

1. Field of the Invention

The present invention relates to a nonvolatile storage element, particularly to a transistor type ferroelectric nonvolatile storage element using a ferroelectric body for a gate thereof and a method of fabricating the same.

2. Description of the Related Art

As a transistor type ferroelectric nonvolatile storage element, there is MFS-FET(Metal-Ferroelectric-Semiconductor-Field Effect Transistor: conductor film-ferroelectric film-semiconductor-field effect type transistor) having a construction in which an oxide film constituting an insulating film of normal MOS-FET(Metal Oxide Semiconductor-Field Effect transistor: conductor film-oxide film-semiconductor-field effect transistor) as a basic structure thereof. The MFS-FET type memory is of a type in which polarization of a ferroelectric body changes threshold voltage of the transistor and a change in resistance of a channel between a source and a drain is read as a change in large or small of a drain current value. This type is characterized by nondestructive reading in which information is not destructed by a reading operation at low voltage since ON/OFF of the transistor is maintained by holding residual polarization of the ferroelectric body.

According to MFS-FET arranged with a ferroelectric body at its gate, it is difficult to produce an excellent interface between the ferroelectric body (F) and the semiconductor (S). A method of avoiding the difficulty is classified into two kinds in gross classification. According to one of the methods, in a ferroelectric transistor having a structure of MFIS (Metal -Ferroelectric-Insulator-Semiconductor: conductor film -ferroelectric body film-insulator film-semiconductor), an insulating film (I) is sandwiched between the ferroelectric body film (F) and the semiconductor (S) of an MFS structure. The ferroelectric body induces electric charge on a surface of a semiconductor substrate via a gate insulating film by polarization thereof.

According to other of the methods, in a ferroelectric body having a structure of MFMIS (Metal-Ferroelectric-Metal -Insulator-Semiconductor: conductor film-ferroelectric film-conductor film-insulating film-semiconductor), a conductor film (M) (or referred to as floating gate) is sandwiched between the ferroelectric body film (F) and the insulating film (I) of the MFIS structure. The invention relates to latter of the MFMIS structure.

Further, a conductor film or a conductor layer described in the specification, includes a metal as well as a conductor of polycrystal silicon, or an alloy of a metal and polycrystal silicon or the like.

According to a conventional MFMIS type ferroelectric memory, as shown by FIG. 4A, a source region 42 and a drain region 43 are formed on a semiconductor substrate 41, at a main face of the semiconductor substrate therebetween, there are laminated an oxide film ($SiO_2$) 44 constituting a gate oxide film and polysilicon (Poly-Si) 45 constituting a lower conductor film, there is laminated Ir/$IrO_2$ (iridium/iridium oxide) constituting a barrier film 46 constituting the lower conductor film and for preventing mutual diffusion between a ferroelectric body material and Poly-Si further thereabove, there is laminated a ferroelectric body thin film (for example, PZT (PbZr$_x$Ti$_{1-x}$O$_3$) ) 47 thereabove and there is laminated an upper conductor film 48, that is, Ir/$IrO_2$ constituting a gate electrode thereabove. A gate structure 49 is formed by subjecting the laminated films to lithography and etching. (Reference: T Nakamura et al. Dig. Tech. Pap. of 1995 I EEE Int. Solid State Circuits Conf. p.68 (1995))

FIG. 4B represents the MFMIS structure of FIG. 4A by an equivalent circuit and capacitance ($C_F$) of a ferroelectric body capacitor comprising the upper MFM structure and capacitance ($C_I$) of a gate insulator capacitor comprising the lower MIS structure, are connected in series. In FIG. 4B, when voltage is applied between the upper electrode A and the semiconductor substrate B to thereby polarize the ferroelectric layer, it is necessary from a view point of a memory holding characteristic to apply the voltage to sufficiently saturate polarization of the ferroelectric body.

Voltage distributed to the ferroelectric capacitor, is dependent on a coupling ratio ($C_I/(C_I+C_F)$) of the capacitance ($C_F$) of the ferroelectric capacitor and the capacitance ($C_I$) of the gate insulator capacitor.

In order to increase the voltage distributed to the ferroelectric capacitor, it is important to design such that the capacitance ($C_I$) of the gate insulator capacitor becomes larger than the capacitance ($C_F$) of the ferroelectric body capacitor.

Hence, it is conceivable to thin the gate insulating film and thicken the ferroelectric thin film in order to design such that the capacitance ($C_I$) of the gate insulator capacitor becomes larger than the capacitance ($C_F$) of the ferroelectric capacitor, however, there is a limit in thinning the gate insulator film 44 in view of withstand voltage and leakage current. Further, when the ferroelectric body thin film 47 is thickened, in order to saturate polarization of the ferroelectric body, high drive voltage is needed.

A conventional method of making the capacitance ($C_I$) of the gate insulator capacitor larger than the capacitance ($C_F$) of the ferroelectric capacitor by avoiding these problems, is a method of changing areas of the capacitance ($C_F$) and the capacitance ($C_I$) FIG. 4C shows a simple schematic sectional view of carrying out the method. There is provided an MFMIS structure having the ferroelectric layer at only a portion of an area of the MIS (conductive body-insulator-semiconductor) portion for constituting $C_I$. By the conventional method, $C_I$ can be designed to be larger than $C_F$ as necessary.

The conventional structure as shown by FIG. 4A poses a problem that after forming the MFMI structure (gate structure 49) by the same dimensions, when impurities are introduced to the source region 42 and the drain region 43 and a heat treatment such as activation is carried out, impurities included in the ferroelectric body are extricated and diffused to silicon to thereby deteriorate the device characteristic.

Further, when an end face of the MFMI structure is summarizingly machined as in FIG. 4A, damage is caused at a sidewall thereof and therefore, a leakage path is formed. The leakage path is formed in, for example, dry etching, by adhering an electrode material (conductor material) scraped off in etching and a formed product (conductive) of a resist to the sidewall of the ferroelectric body. When the leakage path is formed, leakage current is conducted to the leakage path, electric charge is accumulated at the lower conductor film (polysilicon film 45, barrier film 46) of the MFMI structure and electric line of force from the ferroelectric film 47 are blocked. As a result, there poses a problem that carriers on the surface of the semiconductor substrate 41 are extinguished, although polarization remains, drain current is prevented from flowing and stored information is extinguished.

Meanwhile, even in the conventional structure in which the area of the upper conductor film of the MFMI structure is made to be smaller than the area of the lower structure in order to make the capacitance ($C_I$) of the gate insulator capacitor lager than the capacitance ($C_F$) of the ferroelectric capacitor as shown by FIG. 4C, after machining the respective films similarly by lithography and etching, when impurities are introduced to the source region 42 and the drain region 43 and a heat treatment such as activation or the like is carried out, impurities included in the ferroelectric body are extricated and diffused to the silicon to thereby pose the problem of deteriorating the device characteristic and cause damage to the side wall and therefore, the leakage path is formed. When the leakage path is formed, leakage current is conducted to the leakage path, electric charge is accumulated at the lower conductor film (polysilicon film 45, barrier film 46) and electric lines of force from the ferroelectric film 47 are blocked. As a result, carriers on the surface of the semiconductor substrate 41 are extinguished, although polarization of the ferroelectric body remains, drain current is prevented from flowing and there poses the problem that the stored information is extinguished.

In order to prevent contamination by the ferroelectric body as described above, as shown by FIG. 5A, there is provided a method in which after forming a normal MOS transistor 51, a ferroelectric body capacitor is connected to a gate 54 of the MOS transistor 51 via a contact hole 53 perforated at an interlayer insulating film 52. However, according to the structure, there is needed an allowance of positioning the gate 54 of the MOS transistor 51 and the contact hole 53 and therefore, a gate electrode width (gate length) cannot be shortened to a minimum machining dimension. Further, when the positioning allowance is made extremely small, for example, as shown by FIG. 5B, there causes a drawback such that the barrier film 46 is connected to the source region 42 and the gate 54, the structure is not operated as a nonvolatile storage element and yield of the transistor is rapidly deteriorated. In this way, according to the ferroelectric transistor having the MFMIS structure, there poses a problem that the gate length cannot be set to a machining dimension of a fabrication process of LSI.

Further, conventionally, as an insulating material of the gate insulating body capacitor, there is used an oxide film having a very small specific inductive capacity ($\epsilon$=3.9), SiON (oxynitride film: $\epsilon$=5 through 7) or a nitride film ($\epsilon$=7 through 8) in comparison with a specific inductive capacity of the ferroelectric material (SBT: $\epsilon$=200, PZT: $\epsilon$=1000) and therefore, in order to design $C_I$ to be larger than $C_F$ as necessary, the area of the gate insulator capacitor needs to be increased.

Hence, in order to design the capacitance ($C_I$) of the gate insulator capacitor to be larger than the capacitance ($C_F$) Of the ferroelectric body capacitor, there has been carried out a trial that the capacitance ($C_I$) of the gate insulator capacitor is increased by using a material having a specific inductive capacity higher than that of oxide film or nitride film species (for example, $CeO_2$) or the like for the gate insulating film, however, when a material having a high specific inductive capacity of, for example, $CeO_2$ or the like, is formed on silicon by 10 nm, there is formed a layer having a low specific inductive capacity of $SiO_2$ or the like by 5 nm between silicon and the insulating film ($CeO_2$) having the high specific inductive capacity and a total film thickness of the insulating film becomes 15 nm and the capacitance per unit area of the gate insulating film capacitor is reduced. As a result, in order to provide the reduced capacitance, it is necessary to increase the area of the gate insulating film capacitor.

SUMMARY OF THE INVENTION

Hence, it is an object of the invention to provide a transistor type ferroelectric body nonvolatile storage element, which can be integrated highly, and having high reliability.

According to an aspect of the invention, there is provided a transistor type ferroelectric body nonvolatile storage element having a gate structure successively laminated with an insulating film, a first conductor film, a ferroelectric body film and a second conductor film on a semiconductor substrate mainly comprising silicon, and a low dielectric constant layer restraining layer formed at an interface between the insulating film, which comprises a high dielectric constant material and the semiconductor substrate.

In this way, there is provided the low dielectric constant layer restraining layer having a thin film thickness including nitrogen at a surface of the semiconductor substrate mainly comprising silicon and therefore, a thick low dielectric constant layer is not formed between the insulating film comprising a high dielectric constant material and the semiconductor substrate. Therefore, a total film thickness of the insulating film is not significantly increased and therefore, in comparison with a case in which the low dielectric constant layer restraining layer is not formed, a gate insulating capacitance per unit area is increased. Therefore, by an amount of increasing the gate insulating capacitance per unit area, it is not necessary to increase an area of the gate insulator capacitor and the memory cell area can be reduced. When a specific example is given, when an insulating film of $CeO_2$ of a high dielectric constant material ($\epsilon$=26), is formed on a semiconductor substrate which is not provided with a low dielectric constant layer restraining layer by 10 nm, a thick low dielectric constant layer of $SiO_2$ or the like is formed between silicon and the insulating film of $CeO_2$ of the high dielectric constant material by 5 nm, however, when the insulating film of $CeO_2$ of the high dielectric constant material ($\epsilon$=26) is formed by 10 nm on the low dielectric constant layer restrain layer having a thin film thickness of 1nm including nitrogen on the surface of the semiconductor substrate, the thick low dielectric constant layer of $SiO_2$ or the like is not formed between silicon and the insulating film of $CeO_2$ of the high dielectric constant material. Therefore, by forming the low dielectric constant layer restraining layer, the total film thickness of the insulating film is not significantly increased and therefore, in comparison with the case in which the low dielectric constant layer restrain layer is not formed, the gate insulating capacitance per unit area is increased by a multiplication factor of about 3 from 0.53 $\mu F/cm^2$ to 1.68 $\mu F/cm^2$. Therefore, by the amount of increasing the gate insulating capacitance per unit area, it is not necessary to increase the area of the gate insulator capacitor and the memory cell area can be reduced.

Further, according to another aspect of the invention, it is preferable that the transistor type ferroelectric body nonvolatile storage element has a structure in which thick films of silicon oxide covering a source region and a drain region are provided, the insulating film is disposed above the silicon oxide films and above a channel region of the semiconductor substrate and lengths of the first conductor film and the insulating thin film in a channel length direction are longer than a length of the channel region.

By constructing the semiconductor device in this way, there are oxide films covering the source region and the drain region and therefore, a contaminating substance from the ferroelectric body thin film is prevented from invading the silicon substrate. When the insulating film and the first conductor film are machined, since the thick oxide films cover the source region and the drain region and therefore, damage of an end face of the gate structure is not extended to the semiconductor substrate and leakage current is restrained.

Further, according to another aspect of the invention, there is provided a method of fabricating a transistor type ferroelectric body nonvolatile storage element which is a method of fabricating a transistor type ferroelectric body nonvolatile storage element having a gate structure successively laminated with an insulating film, a first conductor film, a ferroelectric body film and a second conductor film above a semiconductor substrate mainly comprising silicon, the method comprising a step of forming a dummy gate on the semiconductor substrate, a step of forming a source region and a drain region with the dummy gate as a mask, a step of forming thick films of oxide films covering the source region and the drain region by thermally oxidizing a surface of the semiconductor substrate with the dummy gate as the mask, a step of removing the dummy gate and thereafter forming a low dielectric constant layer restraining layer, and a step of forming the insulating film comprising a high dielectric constant material above the low dielectric constant layer restraining layer, wherein the first conductive film, the ferroelectric body film and the second dielectric film are successively formed above the insulating film.

Further, according to another aspect of the invention, it is preferable that according to the method of fabricating a transistor type ferroelectric body nonvolatile storage element, the low dielectric constant layer restraining layer is formed by an ion implanting method, a nitrogen plasma method, vacuum deposition, a laser ablation method, CVD (Chemical Vapor Deposition), or a sputtering method.

Normally, after forming a ferroelectric body capacitor constituted by laminating and etching a first conductor film, a ferroelectric body film and a second conductor film, ions are implanted to a semiconductor substrate and a source region and a drain region are formed by carrying out a heat treatment and therefore, there is a concern of causing damage to the side wall of the ferroelectric body film by the ion implantation. In contrast thereto, according to the fabricating method of the invention, the ferroelectric body capacitor is formed after forming the source region and the drain region and therefore, there is achieved an advantage that there is not the problem of damage to the sidewall. Further, allowance of positioning with a channel length is ensured by forming the first conductive film and the insulating film such that the first conduct film and insulating film are disposed above the channel and end faces thereof are extended above the thick silicon oxide films. In this way, there can be fabricated the transistor type ferroelectric body nonvolatile storage element by using a self alignment process effectively with regard to the gate structure effectively with regard to the gate structure while promoting reliability.

Further, by using the thick films of the silicon oxide films covering the source and the drain regions, parasitic capacitance of the gate electrode portion can be reduced and high-speed operation can be carried out.

Further, according to the transistor type ferroelectric body nonvolatile storage element and the method of fabricating the same, it is preferable that the insulating film is a layer of a material or a layer laminated with two or more of materials selected from a group consisting of $Ta_2O_5$, $SrTiO_3$, $TiO_2$, $(Ba,Sr)TiO_3$, $Al_2O_3$, $ZrO_2$, $HfO_2$, $Y_2O_3$, $CeO_2$, $CeZrO_2$ and YSZ (yttrium oxide stabilized zirconium oxide).

Further, according to the transistor type ferroelectric body nonvolatile storage element and the method of fabricating the same, it is preferable that the ferroelectric body film is a film of a material selected from a group consisting of $SrBi_2Ta_2O_9$, $PbTiO_3$, $PbZr_xTi_{1-x}O_3$, $Pb_yLa_{1-y}Zr_xTi_{1-x}O_3$, $Bi_4Ti_3O_{12}$, $Pb_5Ge_3O_{11}$, $SrNbO_7$ and $Sr_2Ta_xNb_{l-x}O_7$.

Further, according to the transistor type ferroelectric body nonvolatile storage element and the method of fabricating the same, it is preferable that the conductor film is a layer of material or a layer laminated with two or more of materials selected from a group consisting of platinum, iridium, iridium oxide and conductive polycrystal silicon.

BRIEF OF THE DESCRIPTION OF THE DRAWINGS

DETAILED DESCRIPTION OF THE PREFERRED EMBODIMENTS

A detailed explanation will be given of embodiments of the invention based on examples in reference to the attached drawings as follows. Incidentally the respective drawing only shows outline of a size, a constitution and an arrangement relationship to a degree of being able to understand the invention. Further, numerical values, process conditions, materials and the like described below are simply examples. Therefore, the invention is not limited by the exemplifying embodiments at all.

Figure 1:
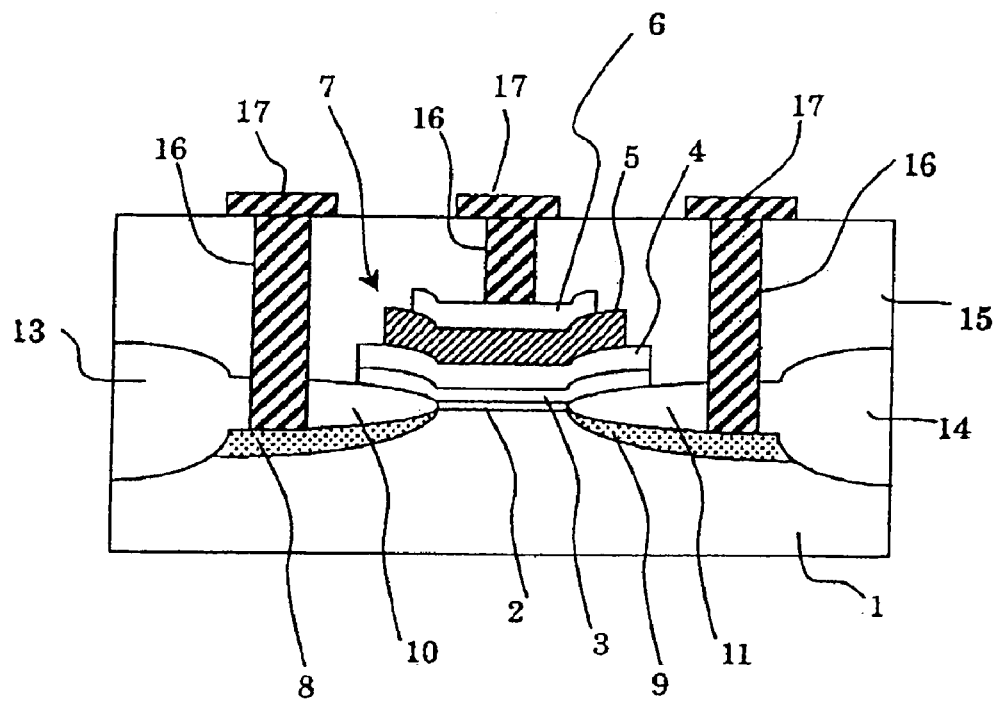
FIG. 1 is a sectional view showing a constitution of a transistor type ferroelectric body nonvolatile storage element according to an embodiment of the invention.

First, an explanation will be given of a constitution of a transistor type ferroelectric body nonvolatile storage element of an example of the invention. FIG. 1 is a sectional view of an essential portion of the transistor type ferroelectric body nonvolatile storage element of the example. The transistor type ferroelectric body nonvolatile storage element of the example is constituted with a gate structure 7 provided with a thin low dielectric constant layer restraining layer 2 at a surface of a channel region of a semiconductor substrate 1 mainly comprising single crystal silicon and successively laminated with an insulating film 3 comprising a high dielectric constant material, a first conductor film 4, a ferroelectric body film 5 and a second conductor film 6 thereon and is provided with MFMIS (Metal-Ferroelectric-Metal-Insulator Semiconductor: conductor film-ferroelectric body film-conductor film-insulating film-semiconductor) structure. Here, the thin low dielectric constant layer restraining layer 2 is a silicon oxynitride film (SiON) and as the insulating film 3, there is used a $CeO_2$ film constituting a material having a specific inductive capacity higher than that of a silicon oxide film generally used as a gate oxide film or a silicon nitride film.

Further, the element of the example is provided with a structure in which there are provided thick films of silicon oxide films 10 and 11 covering a source region 8 and a drain region 9 of the semiconductor substrate 1, the insulating film 3 is disposed above the silicon oxide films 10 and 11 and the lengths of the insulating film 3 and the first conductor film 4 in a channel length direction, are longer than the channel length. The transistor type ferroelectric body nonvolatile storage element is isolated from other element by field oxide films 13 and 14 constituting element isolating regions.

The above-described gate structure 7, the silicon oxide films 10 and 11 and the field oxide films 13 and 14 are covered by an interlayer insulating film 15, the interlayer insulating film 15 is provided with contact holes 16 communicating with respectives of the second conductor film 6, the source region 8 and the drain region 9 and the respective contact holes are provided with wirings by aluminum electrodes 17 to thereby form respective contact portions.

Next, an explanation will be given of a method of fabricating the transistor type nonvolatile storage element. FIGS. 2A through 2I are sectional views in respective steps and a description will be given of a fabricating process in reference to the drawings as follows.

Figure 2A:
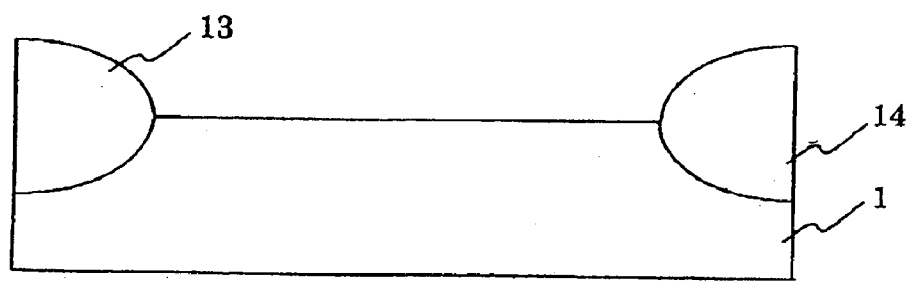
FIG. 2A is a sectional view showing respective step of a method of fabricating the transistor type ferroelectric body nonvolatile storage element according to the embodiment.

First, a semiconductor single crystal substrate of p-type silicon (100) having a resistively of 10Ω cm is made to constitute the semiconductor substrate 1 and as shown by FIG. 2A, there are formed the field oxide films 13 and 14 on the semiconductor substrate 1 for determining active regions.

Figure 2B:
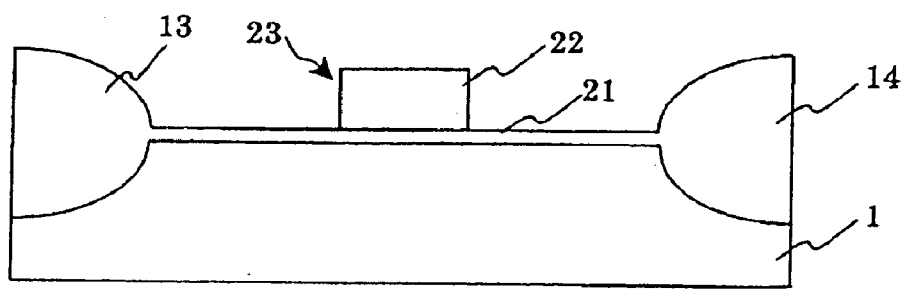
FIG. 2B is a sectional view showing respective step of the method of fabricating the transistor type ferroelectric body nonvolatile storage element according to the embodiment.

Next, as shown by FIG. 2B, after successively laminating an oxide film 21 and a nitride film 22, a dummy gate 23 is formed by normal lithography technology and etching technology. The oxide film 21 is provided with a film thickness, for example, about 35 nm.

Figure 2C:
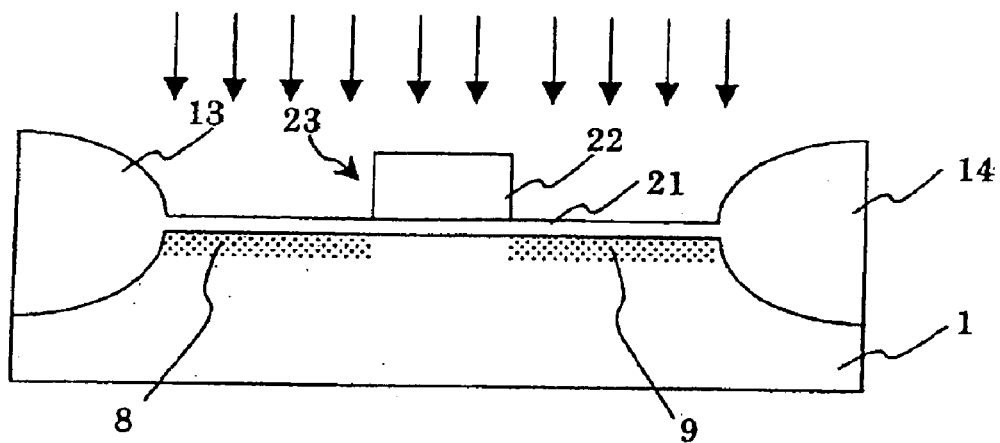
FIG. 2C is a sectional view showing respective step of the method of fabricating the transistor type ferroelectric body nonvolatile storage element according to the embodiment.

Next, as shown by FIG. 2C, in order to form the source region 8 and drain region 9, phosphor is ion-implanted with the dummy gate 23 as a mask.

Figure 2D:
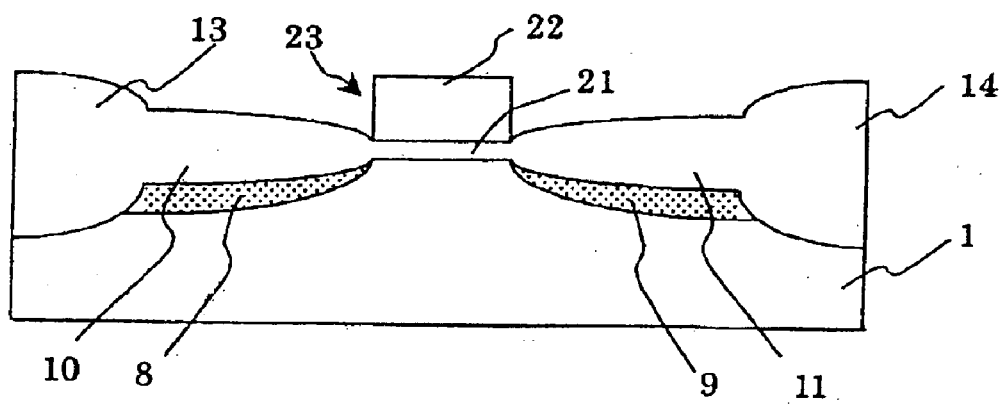
FIG. 2D is a sectional view showing respective step of the method of fabricating the transistor type ferroelectric body nonvolatile storage element according to the embodiment.

Next, as shown FIG. 2D, by annealing the structure at 800 C in an oxygen atmosphere, there are formed the silicon oxide films 10 and 11 covering the source region 8 the drain region 9 respectively.

Figure 2E:
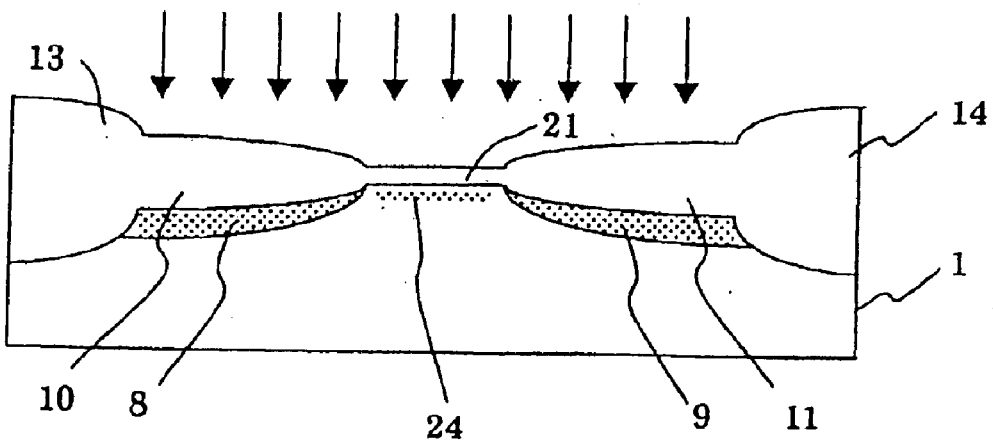
FIG. 2E is a sectional view showing respective step of the method of fabricating the transistor type ferroelectric body nonvolatile storage element according to the embodiment.

Next, as shown by FIG. 2E, after removing the nitride film 22 by phosphoric acid, in order to form the low dielectric constant layer restraining layer 2 for restraining a low dielectric constant layer, nitrogen 24 is implanted to the substrate at an acceleration energy of 15 KeV and a dose amount of 1E 15/cm².

Figure 2F:
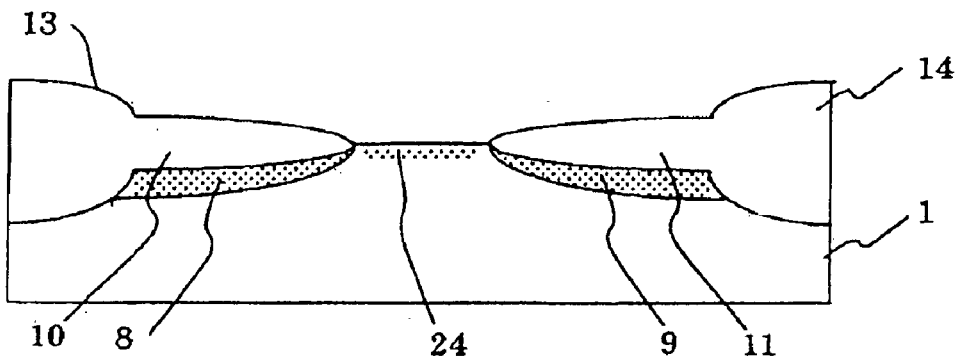
FIG. 2F is a sectional view showing respective step of the method of fabricating the transistor type ferroelectric body nonvolatile storage element according to the embodiment.

Next, as shown by FIG. 2F, the oxide film 21 as a portion of the dummy gate 23 initially formed, is removed by HF (hydrogen fluoride).

Figure 2G:
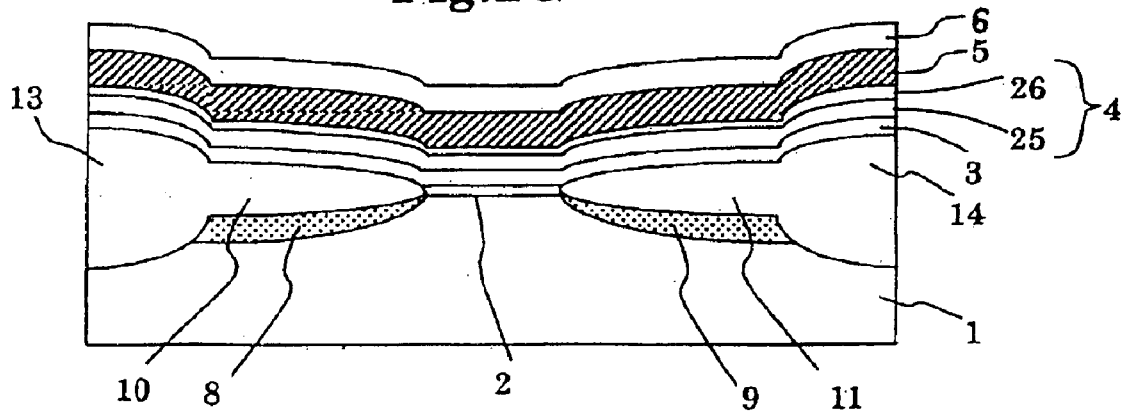
FIG. 2G is a sectional view showing respective step of the method of fabricating the transistor type ferroelectric body nonvolatile storage element according to the embodiment.

Next, as shown by FIG. 2G, after forming the low dielectric constant layer restraining layer 2 having a film thickness of 1 nm on the silicon substrate by carrying out a thermal oxidation processing, $CeO_2$ (cerium oxide) having a film thickness of 10 nm is deposited as the insulating film 3 by using an electron beam vapor deposition method and a heat treatment is carried out at 800° C. in an oxygen atmosphere. At this occasion, an SiON film of 1 nm is present on a surface of the silicon substrate, that is, the semiconductor substrate 1 and therefore, a low dielectric constant layer of $SiO_2$ or the like is not formed at an interface between $CeO_2$ and silicon.

Next, after depositing a polysilicon film 25 including phosphor by 200 nm by a CVD method, there is deposited 200 nm of an $IrO_2$ film 26 constituting a barrier film for preventing mutual diffusion between a ferroelectric body material and polysilicon. The first conductor film 4 is formed by the polysilicon film 25 and the $IrO_2$ film 26.

Next, there is formed 300 nm of an SBT film constituting the ferroelectric body thin film 5 by a spin coating method. For example, the SBT film is formed as follows. First, there is prepared an organic metal solution of strontium (Sr), bismuth (Bi) and tantalum (Ta) comprising 2-ethylhexane hydrochloric acid and the solution is mixed by a rate of Sr:Bi:Ta=0.8:2.2:2 in metallic molar ratios and diluted by hexane to constitute 0.15 molar percent. The chemical solution is dropped to coat on a wafer of the substrate 1 rotated at 2000 rpm, dried at 150° C. in the atmosphere, thereafter dried at 250° C. and dried in a tubular furnace at 400° C. in an oxidizing atmosphere. When the chemical solution is coated again, the operation is repeated and the chemical solution is coated on the wafer and dried by a total of 5 times, the ferroelectric body film 5 of $SrBi_2Ta_2O_9$ (SBT) is formed.

Next, there is deposited a Pt (platinum) film constituting the second conductor thin film 6 by a sputtering method.

Figure 2H:
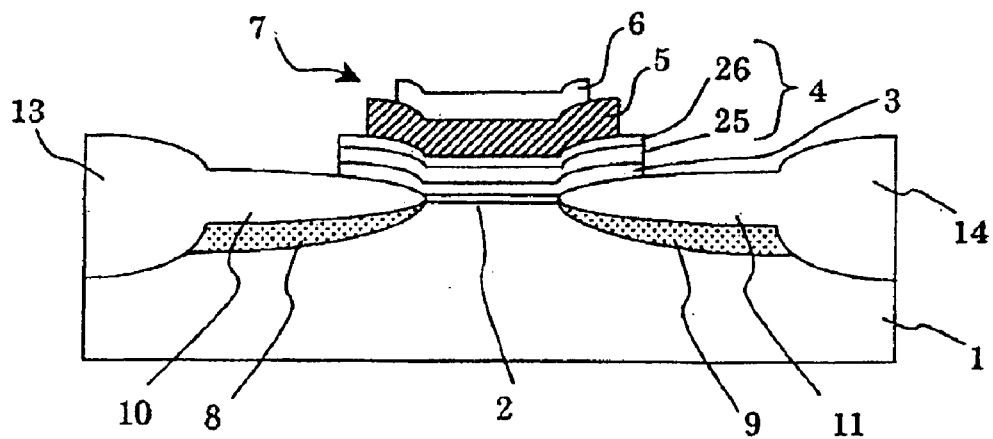
FIG. 2H is a sectional view showing respective step of the method of fabricating the transistor type ferroelectric body nonvolatile storage element according to the embodiment.

Next, as shown by FIG. 2H, by normal lithography technology and dry etching technology, the Pt film constituting the second conductor film 6, the SBT film constituting the ferroelectric body film 5, the $IrO_2$ film 26 and the polysilicon film 25 constituting the first conductor film 4, and the $CeO_2$ film constituting insulating film 3, are successively etched to thereby form the gate structure 7.

Figure 2I:
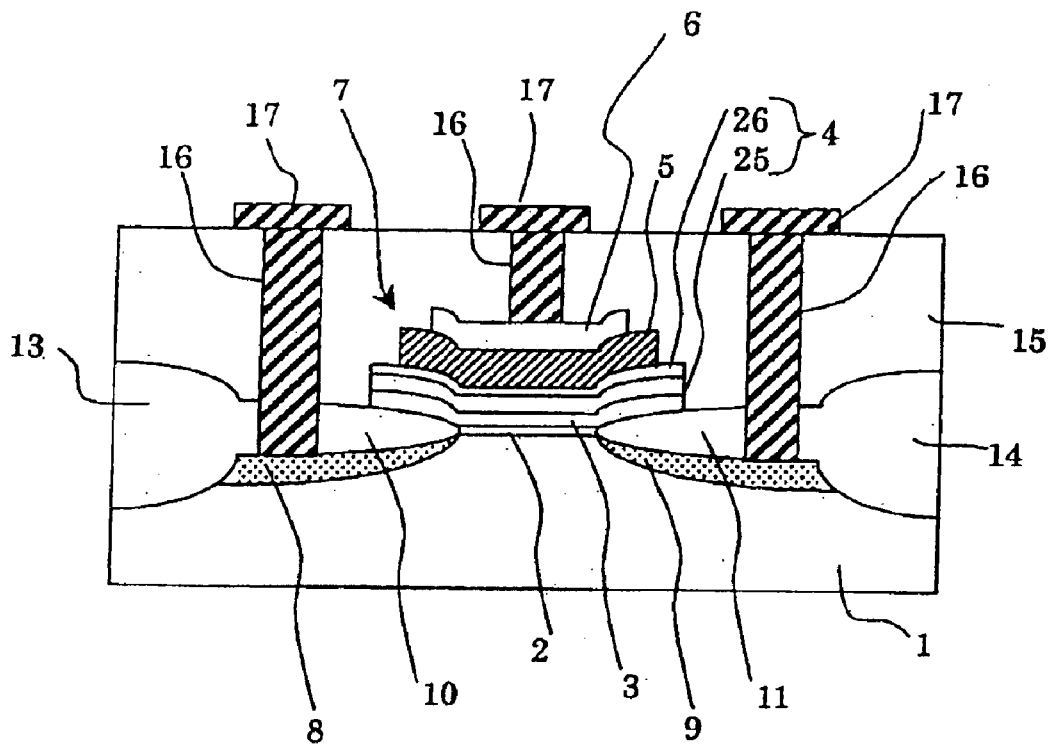
FIG. 2I is a sectional view showing respective step of the method of fabricating the transistor type ferroelectric body nonvolatile storage element according to the embodiment.

Next, as shown by FIG. 2I, after forming a silicon oxide film constituting the interlayer insulating film 15 by plasma CVD, there are perforated the conductor holes 16 respective reaching the second conductor film 6 (Pt film), the source region 8 and the drain region 9 and the aluminum electrodes 17 are formed to thereby finish the transistor type ferroelectric body nonvolatile storage element according to the example.

Figure 3A:
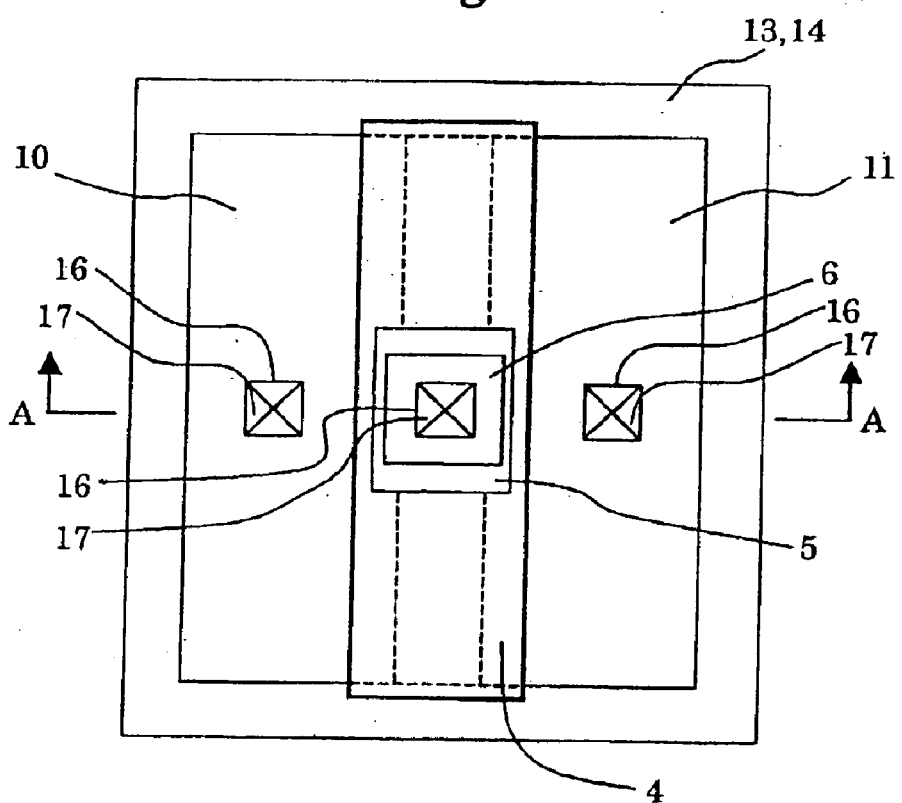
FIG. 3A is a plane view showing a constitution of the transistor type ferroelectric body nonvolatile storage element according to the embodiment of the invention.

Next, FIG. 3A shows a plane view of the finished transistor type ferroelectric body nonvolatile storage element. Further, the above described sectional views (FIG. 1 and FIG. 2I) correspond to a sectional view taken along a line A—A of FIG. 3A. The insulating film 3 and the first conductor film 4 are formed by the same planar shape patterns of which are summarizingly formed by etching and in which the lengths in the channel length direction are longer than the channel length, formed over the silicon oxide films 10 and 11 respectively covering the source region 8 and the drain region 9 and end portions thereof are disposed above the silicon oxide films 10 and 11. Thereby, the channel length can sufficiently be made short in order to operate the transistor at high speed. Further, in addition to being able to constitute a positioning allowance, damage at an end face in etching, can be restrained by barrier films constituted by the silicon oxide films 10 and 11 and can be restrained from being extended to the semiconductor substrate 1.

Areas of the ferroelectric body film 5 and second conductor film 6 patterns of which are successively formed successive to the insulating film 3 and the first conductor film 4, are smaller than areas of the insulating film 3 and the first conductor film 4. By setting the areas, the capacitance ($C_I$) of the gate insulator capacitor comprising the MIS structure constituting the laminated structure of the semiconductor substrate 1 through the first conductor film 4, is made larger than the capacitance ($C_F$) of the ferroelectric body capacitor comprising the MFM structure constituting the laminated structure of the first conductor film 4 through the second conductor film 6.

According to the example, by interposing the low dielectric constant layer restraining layer 2 between the semiconductor substrate 1 and the insulating film 3, there is restrained occurrence of a low dielectric constant layer such as $SiO_2$ produced at the interface between the semiconductor substrate 1 and insulating film 3 when the insulating film 3 comprising the material having a comparatively high inductive capacity such as $CeO_2$, is directly formed on the semiconductor substrate 1. Therefore, a total film thickness of the insulating film between electrodes of the gate insulator capacitor according to the MIS structure, is not significantly increased and therefore, in comparison with a case which the low dielectric constant layer restraining layer is not formed, the gate insulating capacitance per unit area is increased. Therefore, by an amount of increasing the gate insulating capacitance per unit area, it is not necessary to increase the area of the gate insulator capacitor and the memory cell area can be reduced.

Further, by using the dummy gate 23, the source region 8 and the drain region 9 can be formed by self alignment, further, with the dummy gate 23 as the mask, the silicon oxide films 10 and 11 covering the source region 8 and the drain region 9 can be formed. By the silicon oxide films 10 and 11, generation of leakage current or injection of electric charge can be prevented at the end faces of the gate insulating film or the ferroelectric body, further, contamination from the ferroelectric body to the silicon substrate by a heat treatment such as activation can be prevented. Further, by using the thick films of the silicon oxide films 10 and 9 covering the source and the drain regions 8 and 9, parasitic capacitance of the gate electrode portion can be reduced and high-speed operation can also be carried out.

As described above, there can be provided the transistor type ferroelectric body nonvolatile storage element capable of being highly integrated, having high reliability and operated at high speed.

Although according to the above-described example, in the process of forming the low dielectric constant layer restraining layer, the low dielectric constant layer restraining layer is formed by ion-implanting nitrogen to the silicon substrate, otherwise, the process can similarly be carried out by a nitrogen plasma method, vacuum deposition, a laser ablation method, CVD (Chemical Vapor Deposition), or a spattering method.

Further, although according to the above described example, a spin coating method is used in the process of forming the ferroelectric body thin film, otherwise, the process can be carried out by vacuum deposition, a laser ablation method, MOCVD (Metal Organic Chemical Vapor Deposition), LSMCD (Liquid Source Misted Chemical Deposition) or a sputtering method.

Figure 3B:
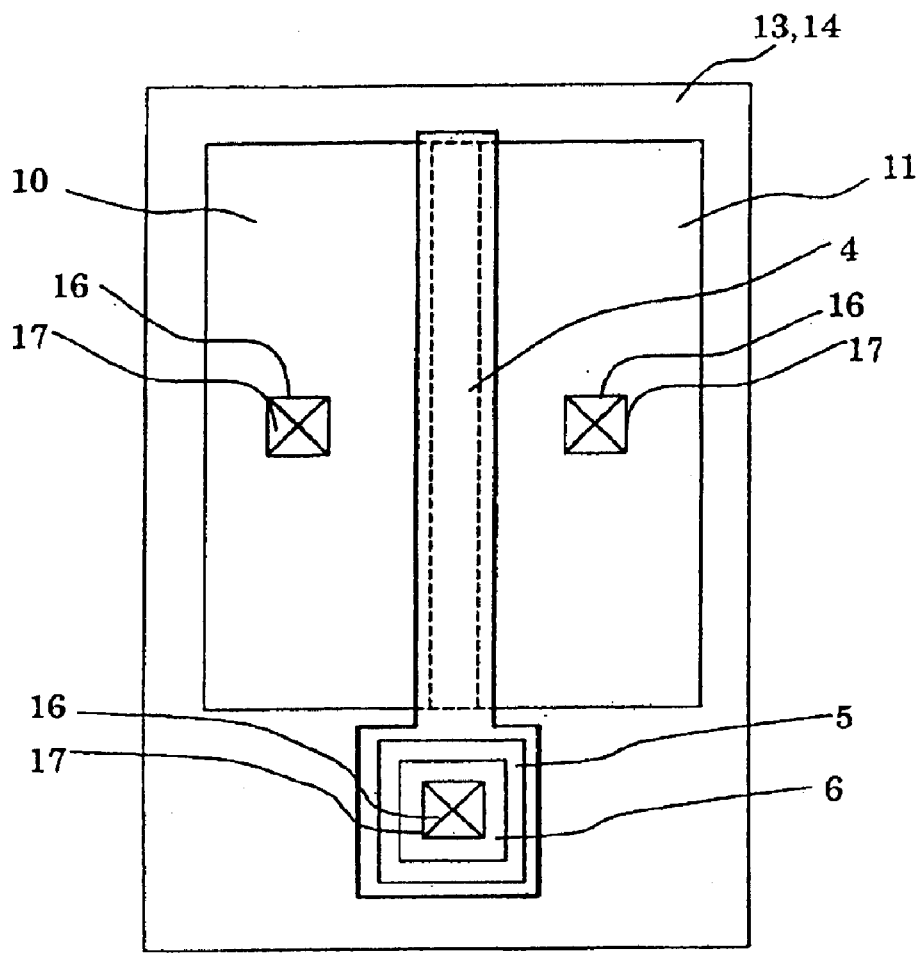
FIG. 3B is a plane view showing a constitution of arranging an MFM structure on an element isolating area in the transistor type ferroelectric body nonvolatile storage element according to the embodiment of the invention.
Figure 4A:
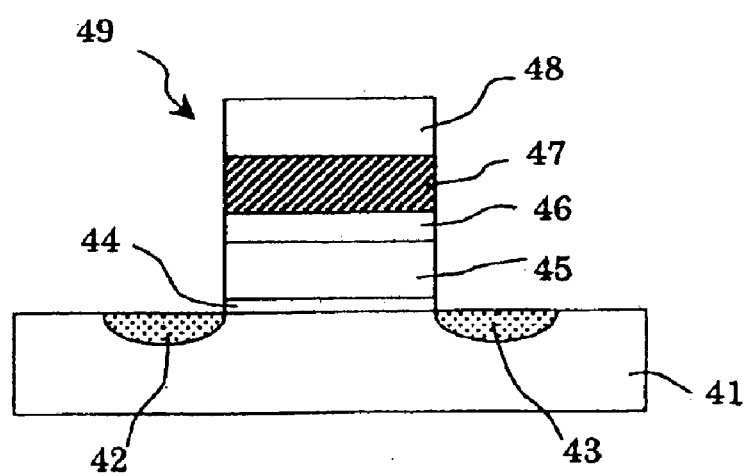
FIG. 4A is a sectional view of a conventional transistor type ferroelectric body nonvolatile storage element having an MFMIS structure.
Figure 4B:
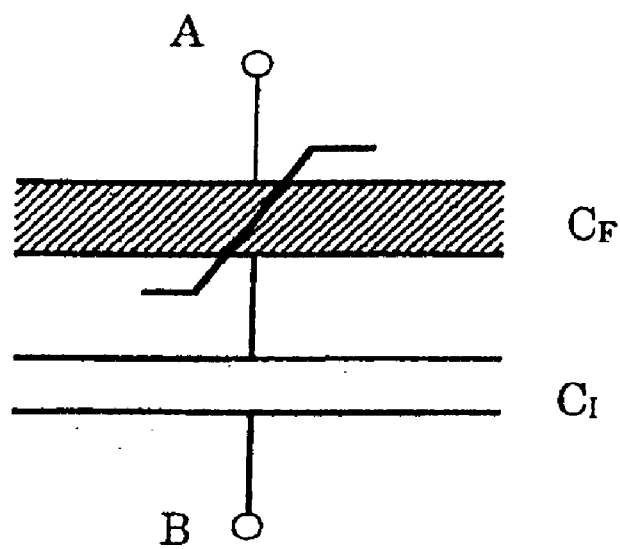
FIG. 4B is an equivalent circuit diagram of the transistor type ferroelectric body nonvolatile storage element.
Figure 4C:
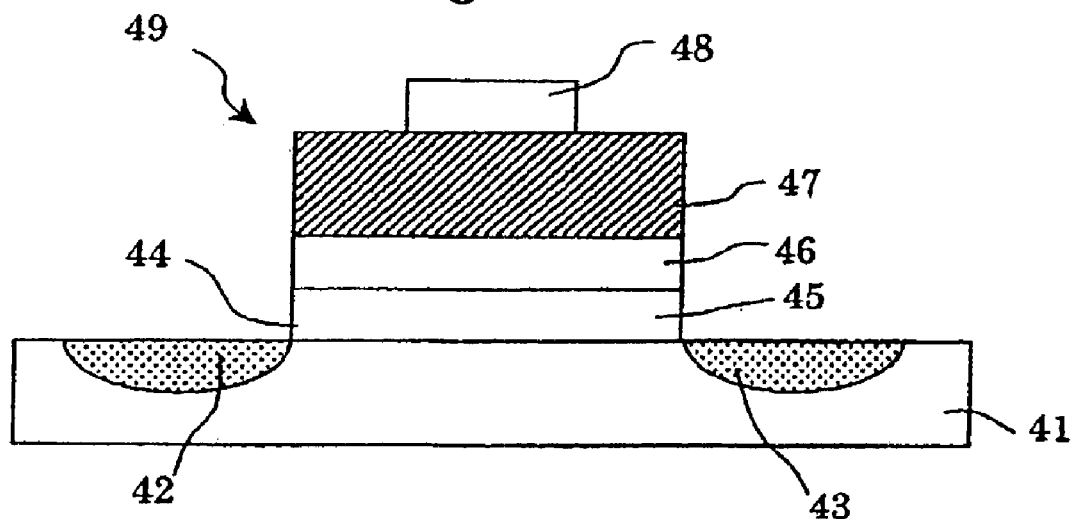
FIG. 4C is a sectional view of the conventional transistor type ferroelectric body nonvolatile storage element having the MFMIS structure.
Figure 5A:
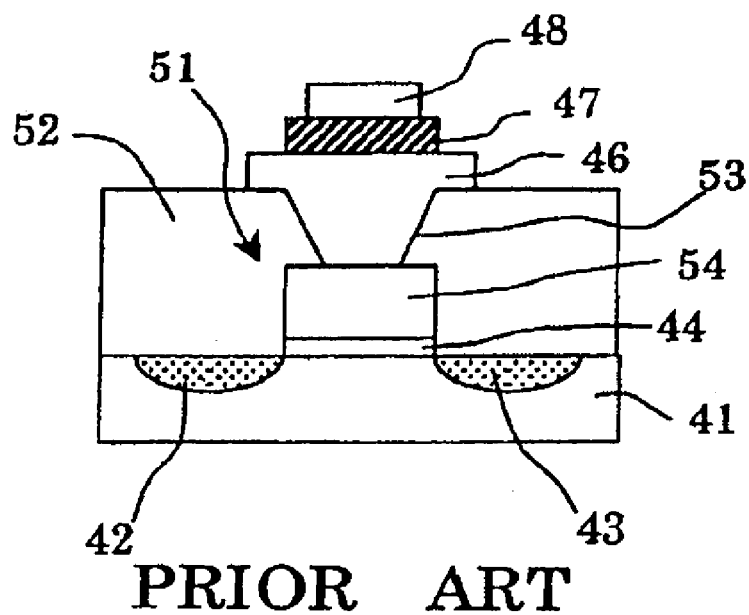
FIG. 5A is a sectional view of a conventional transistor type ferroelectric body nonvolatile storage element having an MFMIS structure.
Figure 5B:
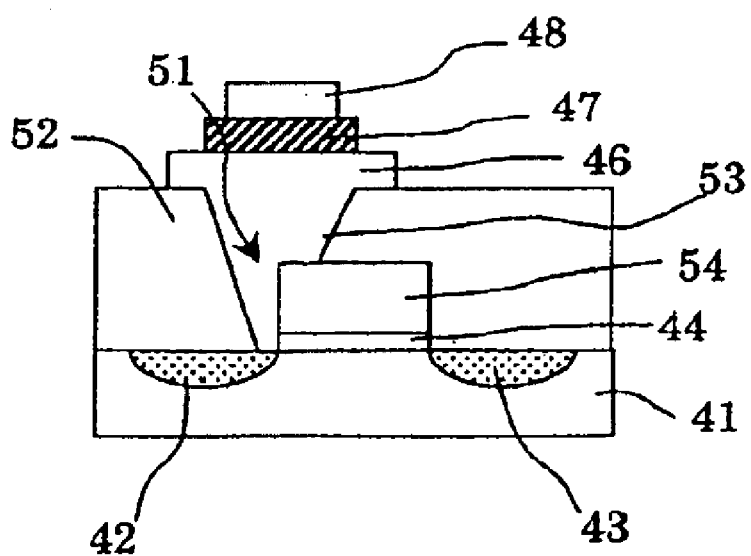
FIG. 5B is a sectional view of the conventional transistor type ferroelectric body nonvolatile storage element having an MFMIS structure.

The contact portion to the upper electrode, that is, the second conductor film 6 explained in the above described example, is not required to be disposed above the channel region but may be disposed above the element isolating region without problem and the above described effect remains the same. FIG. 3B shows a plane view of a transistor type ferroelectric body nonvolatile storage element having such a structure. In this case, the MFM structure constituting the laminated structure of the first conductor film 4 through the second conductor film 6, is formed above the element isolating region 13, 14. According to the example, the size of the contact portion is not dependent on the channel length, an allowance can be provided to positioning and reliability of the transistor type nonvolatile storage element can further be promoted.

Further, the insulating film 3 described in the above described example, can be constituted similarly as a layer of a material selected from a group consisting of $Ta_2O_5$, $SrTiO_3$, $TiO_2$, $(Ba,Sr)TiO_3$, $Al_2O_3$, $ZrO_2$, $HfO_2$, $Y_2O_3$, $C_eO_2$, $CeZrO_2$, YSZ (yttrium oxide stabilized zirconium oxide) other than $CeO_2$. Further, a plurality of layers selected from the group may be laminated.

Further, the ferroelectric body thin film described in the above described first example, can similarly be constituted as a thin film of a material selected from a group consisting of $PbTiO_3$, $PbZr_XTi_{1-X}O_3$, $Pb_YLa_{1-Y}Zr_XTi_{1-X}O_3$, $Bi_4Ti_3O_{12}$, $Pb_5Ge_3O_{11}$, $SrNbO_7$ and $Sr_2Ta_XNb_{1-X}O_7$ other than SBT.

As the conductor thin film, there can be used a thin film mainly comprising one of platinum, iridium, iridium oxide and conductive polycrystal silicon or a structure laminated with two kinds or more of these.

According to the invention, by providing the low dielectric constant layer restraining layer including nitrogen on the semiconductor substrate mainly comprising silicon, even when the insulating film comprising the high dielectric material is used as the gate insulating film, the thick low dielectric constant layer between the insulating film and the semiconductor substrate can be restrained. Therefore, the total film thickness of the insulating film is not increased significantly and therefore, in comparison with the case in which the low dielectric constant layer restraining layer is not formed, the gate insulating capacitance per unit area is increased. Therefore, by the amount of increasing the gate insulating capacitance per unit area, it is not necessary to increase the area of the gate insulator capacitor comprising the laminated structure of the semiconductor substrate, the insulating film and the first conductor film and the memory cell area can be reduced. Thereby, there can be provided the transistor type ferroelectric body nonvolatile storage element which can be integrated highly.

Further, by using the dummy gate, the source region and the drain region can be formed by self alignment, further, there can be formed the thick films of the silicon oxide films covering the source region and the drain region with the dummy gate as the mask. Therefore, generation of leakage current and injection of electric charge are prevented at end faces of the gate insulating film and the ferroelectric body film and contamination from the ferroelectric body to the silicon substrate by a heat treatment such as activation can be prevented. Thereby, there can be provided the transistor type ferroelectric body nonvolatile storage element having high reliability.

Since there are used the thick films of the silicon oxide films covering the source and the drain regions, the parasitic capacitance of the gate electrode portion can be reduced and high speed operation can be carried out. Thereby, there can be provided the transistor type ferroelectric body nonvolatile storage element operated at high speed.

As described above, there can be provided the transistor type ferroelectric body nonvolatile storage element which can be integrated highly, having high reliability and operated at high speed.

What is claimed is:

1. A transistor type ferroelectric body nonvolatile storage element, comprising:

a semiconductor substrate defining a source region, a drain region and a channel region between the source region and the drain region, a channel length direction being defined as a direction along a length of the channel region from the source region to the drain region;

a gate structure including an insulating film, a first conductor film, a ferroelectric body film and a second conductor film successively laminated on the semiconductor substrate;

a low dielectric constant layer restraining layer formed at an interface between the insulating film and the semiconductor substrate, and formed only over the channel region;

a first thick silicon oxide film covering the source region and having a boundary with the channel region, a thickness of the first silicon oxide film increasing with distance from the boundary between the first silicon oxide film and the channel region; and a second thick silicon oxide film covering the drain region and having a boundary with the channel region, a thickness of the second silicon oxide film increasing with distance from the boundary between the second silicon oxide film and the channel region, the insulating film and the first conductor film being arranged above the channel region of the semiconductor substrate and above and only partially covering the first and second silicon oxide films such that lengths of the first conductor film and the insulating film in the channel length direction are longer than a length of the channel region, the lengths of the first conductor film and the insulating thin film in the channel length direction being longer than a length of the ferroelectric body film in the channel length direction and the length of the ferroelectric body film in the channel length direction being longer than a length of the second conductor film in the channel length direction.

2. The transistor type ferroelectric body nonvolatile storage element according to claim 1, wherein an effective area of a ferroelectric body capacitor comprising the first conductor film, the ferroelectric body film and the second conductor film, is smaller than an area of the channel region.

3. The transistor type ferroelectric body nonvolatile storage element according to claim 1:

wherein the insulating film is a layer of at least one material laminated with two or more of materials selected from a group consisting of $Ta_2O_5$, $SrTiO_3$, $TiO_2$, $(Ba,Sr)TiO_3$, $Al_2O_3$, $ZrO_2$, $HfO_2$, $Y_2O_3$, $CeO_2$, $CeZrO_2$ and YSZ (yttrium oxide stabilized zirconium oxide).

4. The transistor type ferroelectric body nonvolatile storage element according to claim 1:

wherein the ferroelectric body film is a film made of a material selected from a group consisting of $SrBi_2Ta_2O_9$, $PbTiO_3$, $PbZr_xTi_{1-x}O_3$, $Pb_yLa_{1-y}Zr_xTi_{1-x}O_3$, $Bi_4Ti_3O_{12}$, $Pb_5Ge_3O_{11}$, $SrNbO_7$ and $Sr_2Ta_xNb_{1-x}O_7$.

5. The transistor type ferroelectric body nonvolatile storage element according to claim 1:

wherein the first or second conductor film is a layer of a material or a layer laminated with two or more of materials selected from a group consisting of platinum, iridium, iridium oxide and conductive polycrystal silicon.

6. The transistor type ferroelectric body nonvolatile storage element according to claim 1, wherein the semiconductor substrate mainly comprises silicon.

7. The transistor type ferroelectric body nonvolatile storage element according to claim 1, wherein the insulating film comprises a material having a high dielectric constant.

8. The transistor type ferroelectric body nonvolatile storage element according to claim 1, wherein the second conductor film is arranged above the channel region.

* * * * *